(12) United States Patent
Thumati

(10) Patent No.: US 9,535,716 B2
(45) Date of Patent: Jan. 3, 2017

(54) CONFIGURATION GRADING AND PRIORITIZATION DURING REBOOT

(71) Applicant: Alcatel-Lucent USA, INC., Murray Hill, NJ (US)

(72) Inventor: Vishnukumar S. Thumati, San Jose, CA (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 170 days.

(21) Appl. No.: 14/496,739

(22) Filed: Sep. 25, 2014

(65) Prior Publication Data

US 2016/0092244 A1 Mar. 31, 2016

(51) Int. Cl.
*G06F 9/00* (2006.01)
*G06F 15/177* (2006.01)
*G06F 9/44* (2006.01)
*H04L 12/24* (2006.01)
*H04W 40/02* (2009.01)
*H04W 28/18* (2009.01)
*H04W 76/02* (2009.01)
*H04L 29/06* (2006.01)
*H04W 80/04* (2009.01)
*G06F 17/50* (2006.01)

(52) U.S. Cl.
CPC .......... *G06F 9/4416* (2013.01); *G06F 9/4411* (2013.01); *G06F 17/5077* (2013.01); *G06F 2203/0384* (2013.01); *H04L 29/0621* (2013.01); *H04L 41/0806* (2013.01); *H04L 41/0813* (2013.01); *H04W 28/18* (2013.01); *H04W 40/02* (2013.01); *H04W 76/02* (2013.01); *H04W 80/04* (2013.01)

(58) Field of Classification Search
CPC ............ H04L 41/0806; H04L 41/0813; H04L 29/0621; H04W 76/02; H04W 40/02; H04W 80/04; H04W 28/18; G06F 9/4411; G06F 17/5077; G06F 2203/0384; G06F 9/4416
See application file for complete search history.

(56) References Cited

U.S. PATENT DOCUMENTS

| 6,930,984 | B1 | 8/2005 | Nomura et al. |
| 7,603,445 | B1 * | 10/2009 | Fehrle ................. G06F 9/44505 370/254 |
| 7,783,733 | B1 | 8/2010 | Yip et al. |
| 8,589,352 | B2 | 11/2013 | Matsubara et al. |
| 2003/0221094 | A1 * | 11/2003 | Pennarun .............. G06F 9/4416 713/1 |
| 2004/0203799 | A1 * | 10/2004 | Siegel ..................... H04L 45/00 455/445 |
| 2005/0086454 | A1 * | 4/2005 | Morigaki .............. G06F 11/364 712/227 |
| 2006/0112240 | A1 | 5/2006 | Walker et al. |
| 2007/0283139 | A1 * | 12/2007 | Kato ..................... G06F 9/4401 713/2 |

(Continued)

*Primary Examiner* — Xuxing Chen
(74) *Attorney, Agent, or Firm* — Kramer & Amado, P.C.

(57) ABSTRACT

Various exemplary embodiments relate to a method of configuring a device in a network, the method including loading one or more system configuration commands into an active memory; processing the one or more system configuration commands; loading one or more blocks of customer commands into an active memory; and processing each of the one or more blocks of customer commands, wherein each block is processed as soon as it is loaded into the active memory.

25 Claims, 4 Drawing Sheets

(56) References Cited

U.S. PATENT DOCUMENTS

| | | | |
|---|---|---|---|
| 2011/0296151 A1* | 12/2011 | Martinez | G06F 8/71 713/1 |
| 2013/0080754 A1* | 3/2013 | Ganesh | G06F 9/4403 713/2 |

* cited by examiner

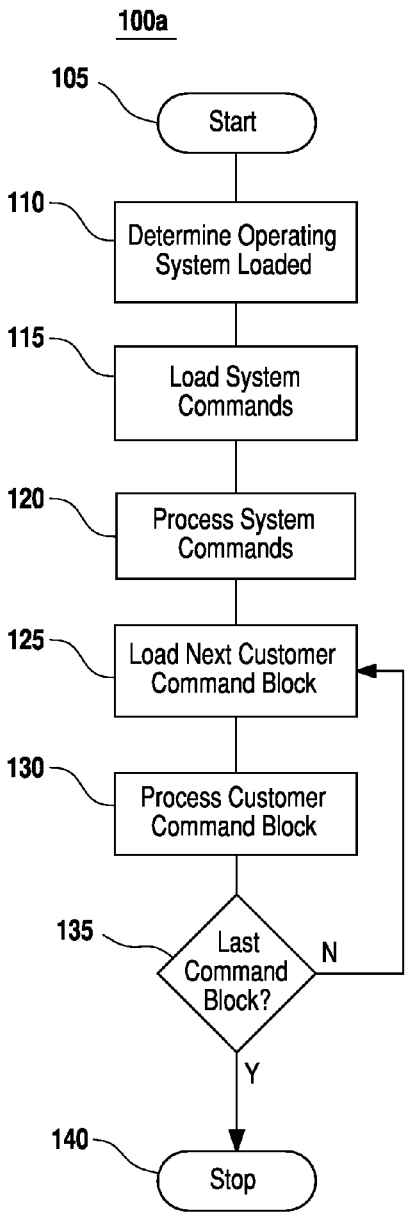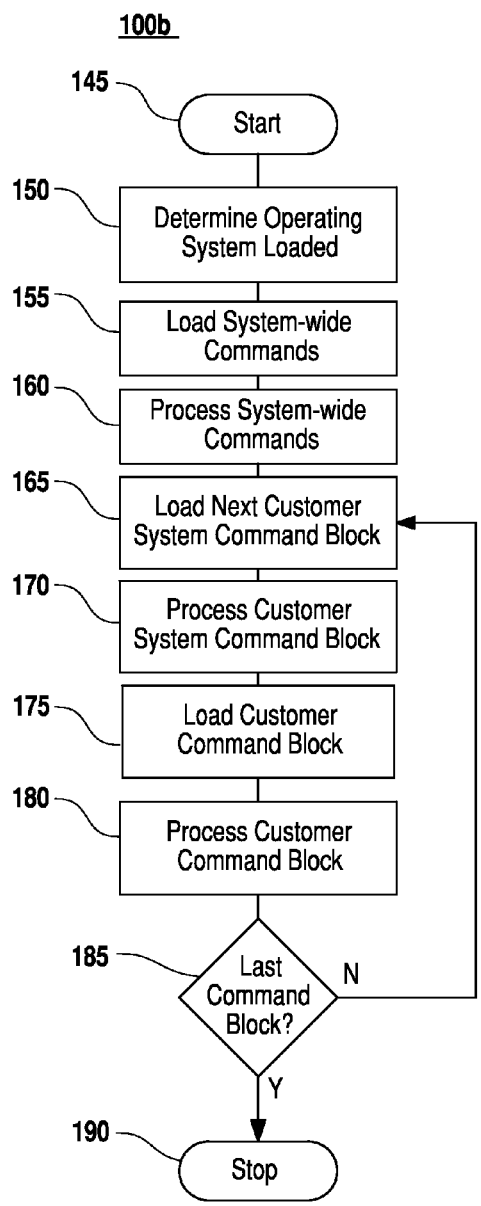
FIG. 1a
FIG. 1b

200

| System | | Priority = 0 |
|---|---|---|
| Parameter | Grade | Timestamp |
| Card | 0 | Jun 19, 2014 10:23:14 TMZ |
| Port | 1 | May 6, 2014 11:04:16 TMZ |
| VLAN | 5 | Jan 18, 2014 07:35:20 TMZ |
| MTU | 5 | May 3, 2014 13:52:02 TMZ |
| LAG | 3 | Jun 11, 2014 17:37:15 TMZ |
| Filter | 2 | Jun 5, 2014 06:52:42 TMZ |
| L3 Route Interface | 4 | Apr 15, 2014 14:47:02 TMZ |
| OSPF | 2 | Mar 1, 2014 12:30:58 TMZ |
| MPLS | 2 | Apr 8, 2014 18:15:33 TMZ |
| RSVP | 6 | Jun 19, 2014 17:18:58 TMZ |
| Service | 6 | Jun 23, 2014 16:00:55 TMZ |

| Customer 1 | | Priority = 5 |
|---|---|---|
| Parameter | Grade | Timestamp |
| Card | 0 | Mar 10, 2014 17:12:37 TMZ |
| Port | 1 | Feb 9, 2014 22:15:53 TMZ |
| LAG | 3 | Apr 12, 2014 18:37:09 TMZ |
| Filter | 2 | May 10, 2014 10:58:05 TMZ |
| L3 Route Interface | 4 | Mar 16, 2014 10:13:00 TMZ |
| OSPF | 2 | Apr 24, 2014 19:53:37 TMZ |
| MPLS | 2 | Jan 21, 2014 09:10:22 TMZ |
| BGP | 6 | Mar 11, 2014 08:32:56 TMZ |
| VPRN | 6 | Mar 8, 2014 12:45:13 TMZ |

FIG. 2a

Configuration (continued)

| Customer 2 | | Priority = 10 |
|---|---|---|
| Parameter | Grade | Timestamp |
| Card | 0 | Mar 10, 2014 17:12:37 TMZ |
| Port | 1 | Feb 19, 2014 10:42:14 TMZ |
| MTU | 4 | May 12, 2014 06:56:18 TMZ |
| LAG | 3 | Jan 27, 2014 10:23:31 TMZ |
| Filter | 2 | Jan 23, 2014 16:12:17 TMZ |
| L3 Route Interface | 2 | Apr 14, 2014 07:02:56 TMZ |
| OSPF | 2 | May 26, 2014 12:54:09 TMZ |
| MPLS | 2 | Jan 11, 2014 20:00:49 TMZ |
| VPLS | 5 | Apr 8, 2014 20:50:21 TMZ |

| Customer 1 | | Priority = 15 |
|---|---|---|
| Parameter | Grade | Timestamp |
| Card | 0 | May 30, 2014 10:08:33 TMZ |
| Port | 1 | Apr 24, 2014 15:27:04 TMZ |
| VLAN | 4 | Apr 26, 2014 18:35:08 TMZ |
| MTU | 4 | Jan 19, 2014 11:51:39 TMZ |
| LAG | 3 | Mar 16, 2014 07:39:56 TMZ |
| Filter | 2 | Jan 7, 2014 10:25:15 TMZ |
| RSVP | 5 | Feb 21, 2014 22:50:10 TMZ |
| Service | 5 | Mar 31, 2014 12:30:40 TMZ |

FIG. 2b

CONFIGURATION GRADING AND PRIORITIZATION DURING REBOOT

TECHNICAL FIELD

Various exemplary embodiments disclosed herein relate generally to configuration of communications devices.

BACKGROUND

Highly scaled routers may take considerable time to fully reboot before starting switching/routing data. Depending upon the network traffic, port speed, and port density in the device, this may lead to traffic loss of several hundred gigabytes or more.

SUMMARY

In light of the present need for minimized traffic loss due to router down time, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a method of configuring a device in a network, the method including loading one or more system configuration commands into an active memory; processing the one or more system configuration commands; loading one or more blocks of customer commands into an active memory; and processing each of the one or more blocks of customer commands, wherein each block is processed as soon as it is loaded into the active memory. Further embodiments of the method further include reading the one or more system configuration commands from a persistent storage; and reading the one or more blocks of customer commands from a persistent storage. In alternative embodiments, the step of loading the one or more system configuration commands further includes loading one or more system configuration command blocks into the active memory. In some embodiments, the step of processing the one or more system configuration commands further includes processing each system configuration command block as soon as it is loaded into the active memory.

In various embodiments, each customer command block includes one or more configuration elements, wherein each configuration element corresponds to a network hardware element or a network parameter, and the method further includes processing communications traffic using the at least one configuration element, and wherein processing communications traffic begins as soon as the customer command block is processed. In some embodiments, the step of loading one or more blocks of customer commands into an active memory further includes determining an unprocessed customer command block with a highest priority, the unprocessed customer command block including one or more configuration command blocks; and loading each configuration command block into the active memory.

In alternate embodiments, the step of loading each configuration command block into the active memory further includes determining an unprocessed configuration command block with a highest grade, the unprocessed configuration command block including one or more configuration commands that when processed configure a configuration element, wherein each configuration element corresponds to a network hardware element or a network parameter; and loading the unprocessed configuration command block into the active memory. In various embodiments the step of processing each of the one or more blocks of customer commands further includes processing each configuration command block in the order in which it was loaded into active memory. In some embodiments, the step of loading each configuration command block into the active memory further includes determining an unprocessed configuration command block with a highest grade, the unprocessed configuration command block including one or more configuration commands that when processed configure a configuration element, wherein each configuration element corresponds to a network parameter; and loading the unprocessed configuration command block into the active memory. In some embodiments, the step of processing each of the one or more blocks of customer commands further includes determining the unprocessed configuration command block is the same as a processed configuration command block; and discarding the unprocessed configuration command block.

In alternative embodiments, the one or more system configuration commands include system-wide commands. In other embodiments, the one or more system configuration commands include one or more system-wide commands and one or more configuration commands that when processed configure a configuration element, wherein each configuration element corresponds to a network hardware element.

Various exemplary embodiments relate to a non-transitory machine-readable storage medium encoded with instructions for execution by a networked device for configuring the device, the non-transitory machine-readable storage medium including instructions for loading one or more system configuration commands into an active memory; instructions for processing the one or more system configuration commands; instructions for loading one or more blocks of customer commands into an active memory; and instructions for processing each of the one or more blocks of customer commands, wherein each block is processed as soon as it is loaded into the active memory. Some embodiments further include instructions for reading the one or more system configuration commands from a persistent storage; and instructions for reading the one or more blocks of customer commands from a persistent storage.

In some embodiments the instructions for loading the one or more system configuration commands further include instructions for loading one or more system configuration command blocks into the active memory. In alternative embodiments the instructions for processing the one or more system configuration commands further include instructions for processing each system configuration command block as soon as it is loaded into the active memory. In some embodiments each customer command block includes one or more configuration elements, wherein each configuration element corresponds to a network hardware element or a network parameter, and the non-transitory machine-readable storage medium further includes instructions for processing communications traffic using the at least one configuration element, and wherein processing communications traffic begins as soon as the customer command block is processed.

In other embodiments the instructions for loading one or more blocks of customer commands into an active memory further include instructions for determining an unprocessed customer command block with a highest priority, the unprocessed customer command block including one or more configuration command blocks; and instructions for loading each configuration command block into the active memory. In alternate embodiments the instructions for loading each configuration command block into the active memory further includes instructions for determining an unprocessed configuration command block with a highest grade, the unprocessed configuration command block including one or more configuration commands that when processed configure a configuration element, wherein each configuration element corresponds to a network hardware element or a network parameter; and instructions for loading the unprocessed configuration command block into the active memory. In some embodiments the instructions for processing each of the one or more blocks of customer commands further include instructions for processing each configuration command block in the order in which it was loaded into active memory.

In some embodiments, the instructions for loading each configuration command block into the active memory further include instructions for determining an unprocessed configuration command block with a highest grade, the unprocessed configuration command block including one or more configuration commands that when processed configure a configuration element, wherein each configuration element corresponds to a network parameter; and instructions for loading the unprocessed configuration command block into the active memory. In some alternative embodiments, the instructions for processing each of the one or more blocks of customer commands further include instructions for determining the unprocessed configuration command block is the same as a processed configuration command block; and instructions for discarding the unprocessed configuration command block.

In some embodiments, the one or more system configuration commands include system-wide commands. In some embodiments the one or more system configuration commands include one or more system-wide commands and one or more configuration commands that when processed configure a configuration element, wherein each configuration element corresponds to a network hardware element.

It should be apparent that, in this manner, various exemplary embodiments enable minimized router downtime. In particular, by processing each block of customer commands as soon as it is loaded into active memory.

BRIEF DESCRIPTION OF THE DRAWINGS

In order to better understand various exemplary embodiments, reference is made to the accompanying drawings, wherein:

FIG. 1a illustrates an exemplary system-customer mix priority method of beginning to switch data almost immediately after a router reboots;

FIG. 1b illustrates an exemplary absolute-customer priority method of beginning to switch data almost immediately after a router reboots;

FIG. 2a illustrates an exemplary router configuration file;

FIG. 2b illustrates a continuation of the exemplary router configuration file;

DETAILED DESCRIPTION

Figure 3:
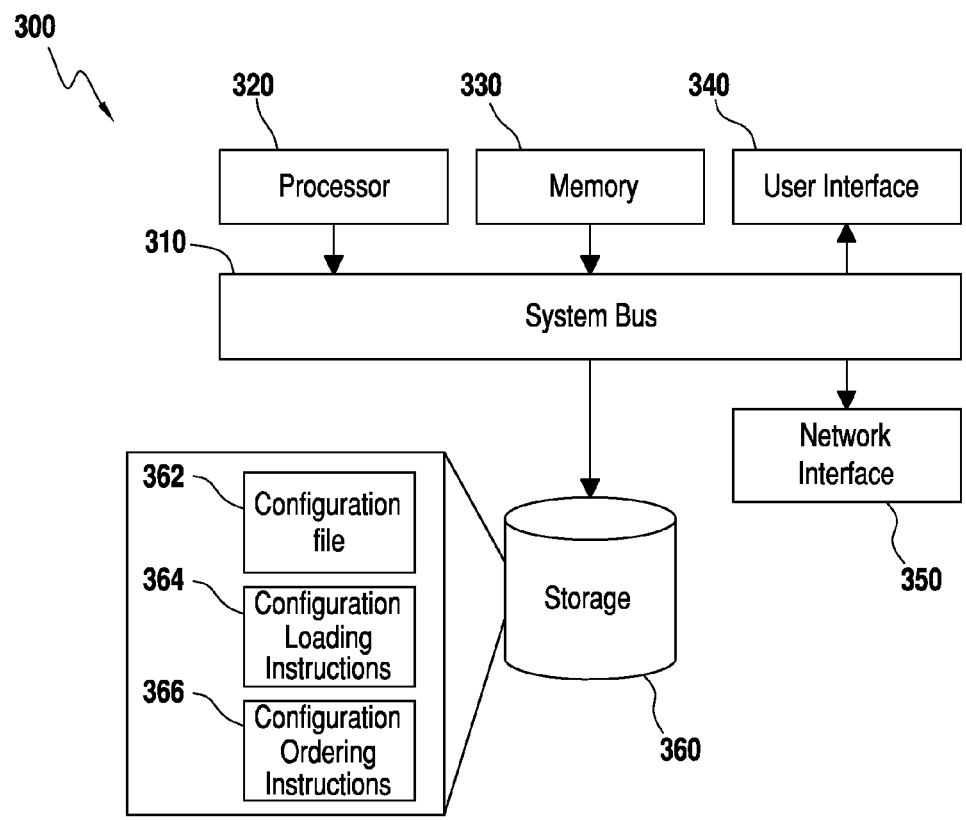
FIG. 3 illustrates an exemplary hardware diagram for a device including a router in a network.

The description and drawings presented herein illustrate various principles. It will be appreciated that those skilled in the art will be able to devise various arrangements that, although not explicitly described or shown herein, embody these principles and are included within the scope of this disclosure. As used herein, the term, "or" refers to a non-exclusive or (i.e., and/or), unless otherwise indicated (e.g., "or else" or "or in the alternative"). Additionally, the various embodiments described herein are not necessarily mutually exclusive and may be combined to produce additional embodiments that incorporate the principles described herein. Further, while various exemplary embodiments are described with regard to routers operating in a network, it will be understood that the techniques and arrangements described herein may be implemented to facilitate configuration after reboot in other types of systems that implement multiple types of data processing or data structure.

Routers may reboot for a variety of reasons, including recovery from a crash or other failure, or as part of maintenance activity. The behavior of functioning routers is determined by configuration files written by system administrators. These configurations pertain to both hardware and software configurations, including line card and port configurations, system settings, and settings relevant to the provisioning of software such as communications services (such as, for example, Layer 2 VPN and Layer 3 VPN) and filtering. When commands are created (e.g. by a user/system administrator) they may be saved onto a hard drive, compact flash, thumb drive, or other persistent storage device, and they are read into active memory (e.g. RAM) at run-time. When the router reboots, due to a system crash or planned maintenance, RAM is wiped out, and all configuration must be read out of persistent storage. The process of rebooting may be one of the slowest processes of the router as a whole, in part because reading data from persistent storage into memory is time consuming.

In the reboot process, highly scaled routers may wait until all configuration information is read from persistent storage into active memory. An exemplary scaled configuration may include large numbers of configuration conditions, expressed in hundreds of thousands of lines of configuration code. The time taken to reboot and load all configuration information will vary depending on a number of factors including the amount of hardware associated with the device, the speed of the routers' control plane processor, and the amount of configuration parameters in persistent storage. Thus, the lower-level system-wide and hardware configurations may be part of the same configuration file as the customer commands. However, where the router waits for the full configuration file to load from persistent storage before processing any of the configurations, hardware lays idle and no traffic may be processed by the router—for example, ports are not brought online, cards are not brought online, and protocols are not configured. In one embodiment of a scaled router that may include 16000 Multiprotocol Label Switching (MPLS) Label-switched paths (LSPs) and associated filters, and 1000 Open Shortest Path First (OSPF) enabled interfaces that are configured during restart, the router may take over 10 minutes to finish loading all configuration information before any traffic processing such as switching/routing may begin. Similar delays may occur with other configurations with large configuration files, e.g. in another exemplary embodiment 10,000 LSPs with associated filters and 5,000 OSPF connections, 15 minutes or more may pass after a reboot before the router begins to process data. If the router connects residential or enterprise customers, they may face a noticeable downtime, and network-dependent systems may themselves need to be restarted, extending the delay. If the router is in use by a business where real-time data speed translates into financial advantage or disadvantage, e.g. in banking, or securities/commodities trading, this can translate into huge data and therefore monetary loss.

Furthermore, once configuration processing has begun, there may be no preference given to the initial processing of different customer's traffic, even where customers ordinarily would be given different prioritization. For instance, ports or line cards may be configured and then brought on line in numerical order rather than based upon customer priority; card and port assignment may be based on when customers were added to the configuration file, so the order of customers being brought on line may be a function of the location of the configuration information in memory after it is loaded from persistent storage, which in turn may depend on when the configuration was added to the configuration file(s). As such, the configuration, provisioning, and commencement of operation for hardware dedicated to high priority customers may occur later than those for other customers. In the worst case scenario, the configurations for the highest priority customers may be processed last. Additionally, because the aforementioned configuration code may run to hundreds of thousands of lines, manually enforcing order on the configuration process would be a difficult and error-prone process.

Thus, methods are described to hasten the router's commencement of data processing and simplify configuration maintenance—these methods may be used independently or together—by processing a configuration block as soon as it is read from persistent storage, grading or prioritizing the configuration commands, and adding information to the configuration file such as an identifier or modification time-stamp for each block configuration. A method for processing a configuration block is described to minimize to the extent possible the amount of time it takes to begin router functionality after rebooting, e.g. first bring up only the basic minimum hardware and software required to begin switching data, and then start almost immediately switching data. An additional method for grading configuration commands is described to prioritize router functionality so that data for high priority customers may begin processing earlier than data for other customers.

In the first method, rather than waiting for all configurations to be read before processing any, the configuration file(s) may be broken into blocks, and each configuration block processed as soon as it is read from persistent storage. Note that although reading the entire configuration during this method will take the same amount of time as waiting to process the entire configuration file, the earliest configuration may become operational much sooner, because it will not have to wait for the remaining configurations to be read from persistent storage before being processed. Thus, the last configuration will take the same amount of time to come online, but the first configuration will be brought online much earlier. As a consequence, the router's hardware and software resources will not be wasted, because they will be enabled as fast as possible.

In the second method, the configuration commands will be graded and/or prioritized. Higher priority commands will be processed earlier than low priority commands, so that important commands within high priority customers' configurations may be processed first. Configuration blocks (e.g., common configurations such as card or port assignments) may be associated with one or more customers, and each customer may have more than one configuration block associated with their account. Thus, each customer account may be assigned a grade of service, but an individual customer may have different accounts with different grades of service, and different functions within a customer account or grade of service may have different levels of priority.

Thus, although a configuration block will have a priority that may be associated with one or more customers' grade of service, a configuration block may be a set of lines or commands that may be useful if processed, not all of the configuration commands relevant to a customer or a grade of service. For example, to bring up a line card, processing just one line of configuration may not be enough—a set of 3-4 lines of configuration must be processed to bring up the card—this set of lines may be a block. Likewise, a port configuration may be one block. A protocol configuration for a single interface (e.g. OSPF), may be one block. Further, a collection of blocks necessary for one customer configuration may be referred to as a block. In some embodiments, each block must have sufficient commands to be read and then processed "meaningfully"—so that a configuration action is advanced or brought to completion.

When the first and second methods are combined, it will take the same amount of time to load all of the configurations as when the router waits for all configurations to be read from persistent storage, but the configurations of the highest priority customers will be processed first. Note that even for the lowest priority customer, the load time will be unchanged because the system will take the same amount of time to read all of the configurations from persistent storage and start to process their data as it would have taken to wait until all 100,000s of lines of configurations were read before processing begins. In short, when priority-based loading as compared to traditional wait-to-read loading is used in combination with on-load processing, almost all users will see a benefit in terms of time until message processing (router functionality) begins, but none will have a detriment—if it took 15 minutes to get all configurations fully loaded without using the methods, it should take 15 minutes when both methods are used. Thus, lower-priority customers will still only wait the amount of time until all configurations are loaded.

On the other hand, the highest-priority customers who used to have to wait until all configurations were read will now only have to wait until basic functionality of the router is restored and their own configurations implemented, for example, for the operating system (OS) and their own ports to come up. Note that this view is somewhat simplified—a person of skill in the art will appreciate that some infrastructure outside of the router will also delay processing such as, for example, building routes through protocol signaling and building internal data structures within the network; nevertheless, customer data will begin processing faster when compared to waiting until all configurations are read and then processing the ungraded configuration in random order; in an ungraded configuration, low priority customer configurations may be processed earlier if placed before high priority customer configurations. Multi-core processors may also be used to expedite the processing of configuration files, where one core may read the configuration and a second or more cores may process the loaded commands.

In addition to the first and second methods, for several management purposes including tracking and debugging, it may be helpful to assign a name-tag to each customer or block configuration, and include a time-stamp to each customer configuration block upon creation, and update the time-stamp on each modification. Naming and prioritizing blocks may also facilitate management functions such as locating blocks associated with a particular customer or priority level, and to edit these blocks once located— otherwise, the large number of commands makes it difficult both to determine processing order, and to locate particular blocks for various maintenance tasks such as editing or debugging.

Referring now to the drawings, in which like numerals refer to like components or steps, there are disclosed broad aspects of various exemplary embodiments.

Configuration commands may consist of system configuration commands such as system-wide security, policies, time, line cards, ports, protocols, etc.; and customer configuration commands, for example, VPRN Service in edge routers. Even where customer configuration priority is not enforced, system configuration commands may be read from persistent storage and processed before customer configuration commands because customer configuration commands may not be initiated until system commands are processed and necessary hardware configured. Configuration blocks may be processed in the order of lower network layer to higher network layer.

Depending on the complexity of the system and the configuration, system commands may be loaded and processed first, and then user commands loaded and processed one block at a time, either in prioritized or other order; or customer configurations may be prioritized and ordered such that all required system configuration (ports/interfaces and protocols) for a prioritized customer may be grouped with that particular customer configuration, and system configurations corresponding to a lower priority customer like specific ports, L3 base interfaces and specific protocols (e.g. PIM) may be loaded only after the high priority system and customer configurations are loaded and processed, if the high priority customer does not need these ports and protocols.

These methods of prioritization may be referred to as "system-customer mix" priority or "absolute-user" priority. For example, in an exemplary router system with twenty (20) cards, each of which has twenty-four (24) ports, the configuration file may be read either so that all of the lower-level configurations for these 20 cards and 480 ports (24 ports by 20 cards) are loaded before processing customer-specific commands (system-mix priority), or load hardware and user configurations strictly according to the requirements of the first or highest priority customer, and then on to the next or next priority customer, and so on (absolute-user priority). If each customer's configuration requires only a few ports, e.g. two or three ports, and one card, in an absolute-user priority method the hardware configuration may also be loaded also by strict priority. This way, the earliest or highest-priority customers will not even have to wait the relatively brief time for all 480 ports to be configured, the only delay before data begins to be processed will be determined by the complexity of the operating system and the configuration required to make their own ports function.

Each method may be used for a variety of reasons. For example, system-user mix priority may be used in complex systems (e.g. with a large number of ports), where from an administrative perspective slicing the port-loading order may be effort-intensive, or, to the contrary, in smaller systems determining port may not be worthwhile where only a few seconds or less may be saved. On the other hand, in large systems, in large or intermediate systems determining port order may be worthwhile despite the front-end effort because a minute or more may be saved by priority customers.

FIGS. 1a and 1b illustrate exemplary methods 100a and 100b of beginning to switch data almost immediately after a router reboots. Method 100a illustrates a system-customer mix priority method. Method 100a begins 105 after the hardware of the router reboots and at step 110 it may be determined that the operating system has completed loading. At step 110, if the configuration file or files are read by the router itself (on its own without outside user or remote commands) from the persistent storage, they may be read as soon as boot-up of the operating system and basic system functionality is complete (e.g. using a startup script or other method for automatic command processing at boot-up (for example, as may be supplied by a vendor)). In some embodiments, the router may be prompted remotely to start loading commands, for example, by a network management device. In this instance, it may be necessary to communicate that the box has booted up sufficiently to load command configurations. In some configurations, a remote device may ping the router after an interval, and occasionally ping the router thereafter until the router sends a response; if the network module sends a response, then it is known that the router has come up to a known level.

At step 110, once the operating system has completed loading, configuration commands may begin loading from persistent storage into active memory at step 115. Configuration commands may include system configuration commands such as basic operating system configurations (to the extent not configured once the OS is running), system-wide security, policies, time, line cards, ports, protocols, etc.; and customer configuration commands, for example, VPRN Service in edge routers. OS and system-wide commands may be fewer in number than customer commands; the number may depend on system and hardware configurations such as the number of cards, ports, etc. Further, some system commands may be vendor specific and may depend upon system architecture, such as, how many modules the vendor has included and the interdependency of the modules. As already noted, the configuration blocks may be processed in the order of lower network layer to higher network layer.

Even where customer priority is not enforced, system configuration commands may be read from persistent storage at step 115 and processed at step 120 before customer configuration commands because customer configuration commands may not be initiated until system commands are processed. Some of the time taken to load and process system commands may be minimized by loading and processing the commands in blocks as described above, e.g. processing earlier-loaded commands while later commands are being loaded into memory from persistent storage. As such, although not shown, steps 115 and 120 may be iterative, continuing until the last block of system commands (that with the highest network layer and/or the most system dependencies) is loaded and processed. For example, system-wide commands and some vendor-specific commands may be loaded first and then processed immediately upon loading, followed by customer system commands and other vendor-specific commands. The manner in which system-wide and customer system commands may be divided is discussed below. The dependencies related to vendor-specific commands may vary, and even differ between each discrete implementation depending upon other configurations.

Once system commands are loaded in step 115 and processed in step 120, in step 125 the first customer command block may be loaded into active memory from persistent storage and in step 130 the block may be processed, and the router immediately begin processing communications traffic based on the customer command block loaded in step 130. As above, the configuration blocks may be processed in the order of lower network layer to higher network layer. In step 135 it may be determined whether there are more customer command blocks. There may be hundreds of thousands of lines of commands, broken into many thousands of command blocks. If it is determined in step 135 that there are any further command blocks, the method returns to step 125 to load the next command block. Otherwise, the router may be fully configured, and the method will end at step 140.

Although steps 125 and 130 refer to "customer" command blocks, in some embodiments configurations that apply to many customers or to other router functions may be deemed lower or lowest priority, and may be loaded and processed after the system commands but before the method ends at step 140. Note that although in FIGS. 1a and 1b reading each successive block of commands, e.g. steps 125, 165, and 175, are shown following processing steps immediately prior (e.g. steps 120 and 130/135 before step 125, steps 160 and 180/185 before step 165, and step 170 before step 175), because reading from persistent storage is usually slower than command processing the methods may not wait until the commands in the block previously loaded from storage are processed, but may process loaded configuration blocks and read pending configuration blocks simultaneously. Where the processing order is faster than the read order, each command block may be processed as soon as it is read. If the read order is faster than the processing order, blocks will be processed in the order they were read.

FIG. 1b illustrates an exemplary absolute-customer priority method 100b. Method 100b begins 145 after the hardware of the router reboots and at step 150 it may be determined that the operating system has completed loading. As noted above with respect to method 100a, some system and vendor commands may be necessary for the processing of any customer configuration and/or data. As such, these system-wide commands will be loaded and processed first in steps 155 and 160, respectively; again, the configuration blocks may be processed in the order of lower network layer to higher network layer. Also as with steps 115 and 120 above, the time taken to load system-wide commands may be minimized by loading and processing the commands in blocks as described above, e.g. processing earlier-loaded commands while later commands are being loaded into memory from persistent storage. As such, although not shown, steps 155 and 160 may be iterative, continuing until the last block of system-wide commands is loaded and processed.

Once system-wide commands are loaded in step 155 and processed in step 160, in step 165 the first customer system command block may be loaded into active memory from persistent storage and in step 170 the customer system command block may be processed. After the customer system command block has been processed (or as discussed above, has commenced processing), the remaining customer configurations may be loaded in step 175, and processed in step 180. Once the entire customer command block has been processed in steps 170 and 180, the router may immediately begin processing communications traffic based on the customer commands loaded in these blocks. In step 185 it may be determined whether there are more customer command blocks. If it is determined in step 185 that there are any further command blocks, the method returns to step 165 to load the next command block. In step 165, after the highest priority customer, some system configurations may have been loaded and processed for higher priority or earlier customers who had configurations for the same hardware. If already configured, these system configuration items may be skipped (not loaded or processed) while writing or processing configurations for the second, later-processed customer block. The determination for skipping blocks is discussed in more detail below. In some embodiments, they may be loaded in step 165 but not processed in step 170.

Otherwise, if it is determined in step 185 that there are no additional command blocks, the router may be fully configured, and the method will end at step 190. As noted above with respect to method 100a, although steps 165 through 180 refer to "customer" command blocks, in some embodiments configurations that apply to many customers or to other router functions may be deemed lower or lowest priority, and may be loaded and processed after the system command blocks in steps 155 and 160, but before the method ends at step 190.

A portion of an exemplary router configuration file 200 is shown in FIGS. 2a and 2b. An element of configuration control may be introduced into the configuration file of FIGS. 2a and 2b. The configuration file 200 may be prioritized and/or graded so that the router may read and process preferred/higher priority customer configurations before configurations for lower/non-preferred customers, leading to lower turn-around time for priority customers after failure or maintenance. For example, in some implementations, each customer/system configuration block or collection of blocks may have a priority 210a, 210b, 210c, 210d. Although configuration file 200 is shown as a collection of tables, configuration file 200 may be implemented in any suitable format such as plain text, code, pseudo-code, markup language, or delimited format.

Note that because system commands (in a system-customer mix priority method) or system-wide commands (in absolute-user priority method) must be processed before customer configurations, system commands will always have the highest priority 210a (which may be signified by the lowest possible value, 0). In a system-customer mix priority method, system oriented minimal configurations such as line-cards, ports and other L2, L3 interfaces and protocols are prioritized first 230a, and customer configurations such as LI configurations, customer specific L2 links, L3 interfaces, and services, are prioritized next 230b. Although priority is shown as a numeric value 210a, 210b, 210c, 210d, priority may be denoted by numbers and/or names/tags 220a, 220b, 220c, 220d, which may make debugging and/or editing easier because they may be easily visible, or by ordering without numbers within the configuration file 200. As already noted, the configuration blocks may be processed in the order of lower network layer to higher network layer. A user such as an administrator may assign priority to customer configurations using a user interface and/or network connection. A grade 240a, 240b, 240c, 240d may be given to individual configurations types (e.g. the card configuration as lowest level, followed by port configuration, then link aggregation, then filters or access control lists) or configuration blocks within a customer configuration set so that prerequisite configurations (e.g. lowest layer to highest layer) are loaded first. In an absolute-customer priority method, system configurations may be graded earlier than customer configurations within customer blocks (these grades may be generated and stored when the customer configurations are saved as described below). In embodiments where grades are not included, the system may enforce load order so that system configurations may be loaded first by name or tag, or ordered first within each customer block.

In some embodiments, a configuration file maintenance algorithm may write or re-write configuration files so that preferred customer configurations are written in the configuration file 200 before others in the priority order. The configuration algorithm may also ensure that any necessary system configurations are grouped so that system configurations needed for a particular customer configuration are processed before the customer commands for that configuration. For example, in a router using an absolute-customer priority method, customer configurations may be automatically prioritized by grading or ordering such that all required system configuration, including ports/interfaces and protocols, for a prioritized customer is grouped with and within that particular customer configuration; typically the configuration blocks are ordered from the lowest network layer to the highest. Furthermore, in some implementations the algorithm may skip any system configuration if it has already been configured while writing configuration for a higher-priority customer. By prioritizing system configurations before customer configurations, all prerequisites such as system hardware, protocols, minimum L2 links, and L3 interfaces required by a provider's topology will be processed before any customer configuration. In an absolute-customer method, system configurations corresponding to one or more lower-priority customers like specific ports, L3 base interfaces and specific protocols (e.g., PIM) need not be configured before the high priority customer configurations, if the high priority customer does not need these ports and protocols.

Both the system-customer mix and absolute-user priority methods are variations of configuration prioritization and provide different levels of difficulty in ordering and writing the configuration. As the configuration is prioritized and ordered with numbers, the priority of any customer configuration may be moved up or down depending on the changing needs of the system or administrator (note, however, that system or system-wide configurations will always remain at the highest priority). Also, note that even without grading of commands, the commands for a single customer 220b, 220d may be given different priority, either because different customer data traffic has different priority or because different customer commands have different priority, simply by placing the commands in different blocks and assigning a different priority 210b, 210d to each block.

If priority numbers or name-tags are used, configuration/debug information specific to a customer may be displayed. For example, only the configuration blocks related to a particular customer may be displayed, or only the customer block names in order, or the grading of the blocks in the configuration file for particular types of configurations. A timestamp such as timestamp 250 may be recorded whenever a configuration is added or modified. The configuration timestamp for each block may be recorded separately, or may be determined based upon the latest timestamp within the block.

Further, by including name tags, priority numbers, and/or other identifiers, configuration management and display may be enhanced to simplify debugging and system management. In some embodiments, various information may be displayed and/or manipulated by using an interface to select information relevant to specific identifiers (e.g. customer or device identifiers), timestamps, or priorities, for example: priorities of customers may be displayed; which customers are connected to and/or affected by devices may be determined and/or displayed; configuration specific to a customer can be displayed, and in some embodiments, a timestamp or timestamps of the customer's configuration or configurations may be displayed, along with the priority or priorities of the customer's configuration or configurations; the configuration of devices specific to a customer may be displayed (e.g. a card or protocol configuration only of an identified customer); a customer's priority may be changed by changing the configuration using the customer's identifier or identifiers; one or more configurations may be deleted using one or more customers' name-tag, other identifier, or priority number; and all configurations may be displayed or listed indicating one or more of the company name, company identifier, priority, and timestamp for each configuration.

Although the above methods and files are described with reference to rebooting of a router, in an alternate embodiment the prioritization method may be used while the router is running. For example, if a number of complex system updates are to be installed all at the same time, prioritization may determine the order in which they may be loaded and processed. Also, new customer information may cause the configuration file to be reordered and/or re-prioritized. For example, if a router is already running and configurations for new customers are added, the new order may be put into the configuration file 200 so that it will treat the new customers as the highest priority the next time the router is rebooted.

The configuration writing algorithm may optimize the processing algorithm as follows. Because the system-wide blocks are processed first, and in both system-mix and absolute-customer methods all configuration blocks are processed in the order of lower network layer to higher network layer; among each network layer, where a lower priority customer shares a configuration with a higher priority customer (or any of the customers share a configuration that is system-wide), the configuration will only be processed for the highest priority customer (or for the system). As one example, system-wide configurations like time or security settings must be configured first, and they are common to all customers, so they will be designated as the highest system priority level by the configuration writing function, which may be designated 0 as at 210a; at reboot the processing method will load 155 and process 160 configurations written at level 0 before any network settings such as card configurations. The system-customer mix priority method will avoid complex re-writing of configuration files for network-level hardware, because all common configurations such as Card, Port, and L3 interfaces, etc. may be grouped and loaded 115, 125 and processed 120, 130 first, e.g. during the writing of the configuration file they may be moved to a system block or a highest priority customer block after system-wide settings and written in order from lowest network layer to highest.

In an absolute user priority method, card configuration may be the next lowest layer after system configuration. The highest priority customer configuration 220b may be written next after the system wide configurations by the writing function, and within the highest priority customer's block the card configuration may be written first so that at reboot time it is loaded 165 and processed 170 first. Then the writing function may write the highest priority customer's next level configuration (typically Port configuration) so that it is processed next after card configuration, and so on. As mentioned above, grades may also be put within a block to enforce processing order; in such cases, as an example, an entire customer block will be read 175 before any commands are processed 180.

In an absolute-customer method, if a subsequent, lower priority customer shares a configuration, e.g. the same card, as a higher priority customer, the card will already be configured when the lower priority customer's block is loaded 165, 175. Thus, the configuration may be skipped and not processed at step 170, 180. The configuration writing function may indicate when the file is written that a configuration element for a customer block is already configured in a higher priority customer's block. The method for determining during reboot processing if a configuration element is already configured may be extremely efficient, with a complexity as low as O(1), for example Current-Customer-Priority>First-Customer-Priority for that configuration element; other implementations are possible, for example a list of elements that have already been configured may be kept in active memory in a cache. The computation time for this comparison may be very low because no storage query, or network hardware configuration will be performed. In the absolute user priority method, this comparison may be done; optionally the configuration element may be processed, e.g. configured, for a second time but a second configuration will be less efficient and not beneficial due to other reasons, for example, it may briefly interrupt the traffic processing for a higher priority customer.

FIG. 3 illustrates an exemplary hardware diagram for a device 300 such as device including a router in a network. The exemplary device 300 may correspond to the network on which the steps of the method of FIG. 1a or 1b are carried out. As shown, the device 300 includes a processor 320, memory 330, user interface 340, network interface 350, and storage 360 interconnected via one or more system buses 310. It will be understood that FIG. 3 constitutes, in some respects, an abstraction and that the actual organization of the components of the device 300 may be more complex than illustrated.

The processor 320 may be any hardware device capable of executing instructions stored in memory 330 or storage 360. As such, the processor may include a microprocessor, field programmable gate array (FPGA), application-specific integrated circuit (ASIC), or other similar devices.

The memory 330 may include various memories such as, for example L1, L2, or L3 cache or system memory. As such, the memory 330 may include static random access memory (SRAM), dynamic RAM (DRAM), flash memory, read only memory (ROM), or other similar memory devices.

The user interface 340 may include one or more devices for enabling communication with a user such as an administrator. For example, the user interface 340 may include a display, a mouse, and a keyboard for receiving user commands.

The network interface 350 may include one or more devices for enabling communication with other hardware devices. For example, the network interface 350 may include a network interface card (NIC) configured to communicate according to the Ethernet protocol. Additionally, the network interface 350 may implement a TCP/IP stack for communication according to the TCP/IP protocols. Various alternative or additional hardware or configurations for the network interface 350 will be apparent.

The storage 360 may include one or more machine-readable storage media such as read-only memory (ROM), random-access memory (RAM), magnetic disk storage media, optical storage media, flash-memory devices, or similar storage media. In various embodiments, the storage 360 may store instructions for execution by the processor 320 or data upon with the processor 320 may operate. For example, the storage 360 may store the configuration file 362. The storage 360 may also store Configuration Loading Instructions 364 for loading and processing configurations according to the concepts described herein. The storage may also store Configuration ordering instructions 366 for ordering the configuration file 362 as described herein.

According to the foregoing, various exemplary embodiments provide for minimizing the time for a router to begin processing customer data following a reboot. In particular, by processing customer configuration information as soon as possible after it is read from persistent storage.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A method of configuring a routing device in a network during bootup of the device such that some routing elements are available before other elements according to a priority schema, the method comprising:
   loading one or more system configuration commands on the routing device into an active memory according to the priority schema;
   processing the one or more system configuration commands;
   loading one or more blocks of customer commands on the routing device into the active memory according to the priority schema after the system configuration commands are loaded, wherein the priority schema enables some routing elements to be available before others; and
   processing each of the one or more blocks of customer commands, wherein each block is processed as soon as it is loaded into the active memory.

2. The method of claim 1, further comprising:
   reading the one or more system configuration commands from a persistent storage; and
   reading the one or more blocks of customer commands from a persistent storage.

3. The method of claim 2, further comprising:
   assigning a first subset of one or more cores of a multi-core processor to carry out the steps of loading one or more system configuration commands into an active memory and loading one or more blocks of customer commands into an active memory; and assigning a second subset of one or more cores of the multi-core processor to carry out the steps of reading the one or more system configuration commands from a persistent storage and reading the one or more blocks of customer commands from a persistent storage.

4. The method of claim 1, wherein the step of loading the one or more system configuration commands further comprises loading one or more system configuration command blocks into the active memory.

5. The method of claim 4, wherein the step of processing the one or more system configuration commands further comprises processing each system configuration command block as soon as it is loaded into the active memory.

6. The method of claim 1, wherein each customer command block comprises one or more configuration elements, wherein each configuration element corresponds to a network hardware element or a network parameter, and the method further comprises processing communications traffic using the at least one configuration element, and wherein processing communications traffic begins as soon as the customer command block is processed.

7. The method of claim 1, wherein the step of loading one or more blocks of customer commands into an active memory further comprises:

determining an unprocessed customer command block with a highest priority, the unprocessed customer command block comprising one or more configuration command blocks; and loading each configuration command block into the active memory.

8. The method of claim 7, wherein the step of loading each configuration command block into the active memory further comprises:

determining an unprocessed configuration command block with a highest grade, the unprocessed configuration command block comprising one or more configuration commands that when processed configure a configuration element, wherein each configuration element corresponds to a network hardware element or a network parameter; and loading the unprocessed configuration command block into the active memory.

9. The method of claim 8, wherein the step of processing each of the one or more blocks of customer commands further comprises:

processing each configuration command block in the order in which it was loaded into active memory.

10. The method of claim 7, wherein the step of loading each configuration command block into the active memory further comprises:

determining an unprocessed configuration command block with a highest grade, the unprocessed configuration command block comprising one or more configuration commands that when processed configure a configuration element, wherein each configuration element corresponds to a network parameter; and loading the unprocessed configuration command block into the active memory.

11. The method of claim 10, wherein the step of processing each of the one or more blocks of customer commands further comprises:

determining the unprocessed configuration command block is the same as a processed configuration command block; and discarding the unprocessed configuration command block.

12. The method of claim 1, wherein the one or more system configuration commands comprise system-wide commands.

13. The method of claim 1, wherein the one or more system configuration commands comprise one or more system-wide commands and one or more configuration commands that when processed configure a configuration element, wherein each configuration element corresponds to a network hardware element.

14. A non-transitory machine-readable storage medium encoded with instructions for execution by a networked routing device for configuring the device during bootup of the device such that some routing elements are available before other elements according to a priority schema, the non-transitory machine-readable storage medium comprising:

instructions for loading one or more system configuration commands on the routing device into an active memory;

instructions for processing the one or more system configuration commands;

instructions for loading one or more blocks of customer commands on the routing device into the active memory according to the priority schema after the system configuration commands are loaded, wherein the priority schema enables some routing elements to be available before others; and instructions for processing each of the one or more blocks of customer commands, wherein each block is processed as soon as it is loaded into the active memory.

15. The non-transitory machine-readable storage medium of claim 14, further comprising:

instructions for reading the one or more system configuration commands from a persistent storage; and instructions for reading the one or more blocks of customer commands from a persistent storage.

16. The non-transitory machine-readable storage medium of claim 14, wherein the instructions for loading the one or more system configuration commands further comprises instructions for loading one or more system configuration command blocks into the active memory.

17. The non-transitory machine-readable storage medium of claim 16, wherein the instructions for processing the one or more system configuration commands further comprises instructions for processing each system configuration command block as soon as it is loaded into the active memory.

18. The non-transitory machine-readable storage medium of claim 14, wherein each customer command block comprises one or more configuration elements, wherein each configuration element corresponds to a network hardware element or a network parameter, and the non-transitory machine-readable storage medium further comprises instructions for processing communications traffic using the at least one configuration element, and wherein processing communications traffic begins as soon as the customer command block is processed.

19. The non-transitory machine-readable storage medium of claim 14, wherein the instructions for loading one or more blocks of customer commands into an active memory further comprises:

instructions for determining an unprocessed customer command block with a highest priority, the unprocessed customer command block comprising one or more configuration command blocks; and instructions for loading each configuration command block into the active memory.

20. The non-transitory machine-readable storage medium of claim 19, wherein the instructions for loading each configuration command block into the active memory further comprises:
   instructions for determining an unprocessed configuration command block with a highest grade, the unprocessed configuration command block comprising one or more configuration commands that when processed configure a configuration element, wherein each configuration element corresponds to a network hardware element or a network parameter; and
   instructions for loading the unprocessed configuration command block into the active memory.

21. The non-transitory machine-readable storage medium of claim 20, wherein the instructions for processing each of the one or more blocks of customer commands further comprises:
   instructions for processing each configuration command block in the order in which it was loaded into active memory.

22. The non-transitory machine-readable storage medium of claim 19, wherein the instructions for loading each configuration command block into the active memory further comprises:
   instructions for determining an unprocessed configuration command block with a highest grade, the unprocessed configuration command block comprising one or more configuration commands that when processed configure a configuration element, wherein each configuration element corresponds to a network parameter; and
   instructions for loading the unprocessed configuration command block into the active memory.

23. The non-transitory machine-readable storage medium of claim 22, wherein the instructions for processing each of the one or more blocks of customer commands further comprises:
   instructions for determining the unprocessed configuration command block is the same as a processed configuration command block; and
   instructions for discarding the unprocessed configuration command block.

24. The non-transitory machine-readable storage medium of claim 14, wherein the one or more system configuration commands comprise system-wide commands.

25. The non-transitory machine-readable storage medium of claim 14, wherein the one or more system configuration commands comprise one or more system-wide commands and one or more configuration commands that when processed configure a configuration element, wherein each configuration element corresponds to a network hardware element.

* * * * *